United States Patent [19]

Dekker et al.

[11] Patent Number: 5,399,899
[45] Date of Patent: Mar. 21, 1995

[54] BIPOLAR EPITAXIAL CASCODE WITH LOW-LEVEL BASE CONNECTION

[75] Inventors: Ronald Dekker; Henricus G. R. Maas; Dirk J. Gravesteijn; Martinus P. J. G. Versleijen, all of Eindhoven, Netherlands

[73] Assignee: U.S. Philips Corporation, New York, N.Y.

[21] Appl. No.: 173,839

[22] Filed: Dec. 27, 1993

[30] Foreign Application Priority Data

Dec. 28, 1992 [EP] European Pat. Off. ............ 92204091

[51] Int. Cl.⁶ .......................................... H01L 29/72
[52] U.S. Cl. .................... 257/566; 257/571; 257/496; 257/586; 257/618
[58] Field of Search ............... 257/170, 571, 586, 618, 257/496, 566

[56] References Cited

U.S. PATENT DOCUMENTS 4,771,013  9/1988  Curran ................................. 437/31
5,084,750  1/1992  Adlerstein ......................... 257/586

FOREIGN PATENT DOCUMENTS 0493854  7/1992  European Pat. Off. .

Primary Examiner—Edward Wojciechowicz
Attorney, Agent, or Firm—Steven R. Biren

[57] ABSTRACT

A semiconductor device with a semiconductor body (1) is provided with a first and a second bipolar transistor (T1, T2, respectively) in a cascode configuration, in which the semiconductor body (1) comprises, in that order, a collector region (10) and a base region (11) of the first transistor (T1), a region (12) which forms both an emitter region of the first transistor (T1) and a collector region of the second transistor (T2), a space charge region (13), and a base region (14) and emitter region (15) of the second transistor (T2), while the regions form pn junctions with one another which extend parallel to a main surface (2) of the semiconductor body (1). The base region (14) and the emitter region (15) of the second transistor (T2) adjoin a main surface (3) of the semiconductor body (1). According to the invention, a depression (4) is provided in this main surface (3), cutting through the emitter region (12) of the first transistor (T1) which at the same time is the collector region (12) of the second transistor (T2), the space charge region (13), and the base region (14) of the second transistor (T2) and laterally bounding these; regions, while a connection electrode (B1) for the base region (11) of the first transistor (T1) is provided in the depression (4). No latch-up by a parasitic transistor then takes place in the device.

5 Claims, 1 Drawing Sheet

BIPOLAR EPITAXIAL CASCODE WITH LOW-LEVEL BASE CONNECTION

BACKGROUND OF THE INVENTION

The invention relates to a semiconductor device with a semiconductor body provided with a first and a second bipolar transistor in a cascode configuration with collector, base and emitter regions which form pn junctions with one another which extend parallel to a main surface of the semiconductor body, which semiconductor body comprises a semiconductor substrate of a first conductivity type which forms the collector region of the first transistor and is provided with a connection electrode on a first main surface of the substrate, a first semiconductor region of the second, opposite conductivity type adjoining the substrate and forming the base region of the first transistor, a second semiconductor region of the first conductivity type adjoining the first region and forming the emitter region of the first transistor and forming the collector region of the second transistor, a third semiconductor region of the first conductivity type adjoining the second region and more weakly doped than the second region, a fourth semiconductor region of the second conductivity type adjoining the third region and a second main surface of the semiconductor body and forming the base region of the second transistor, which fourth semiconductor region is provided with a connection electrode, and a fifth semiconductor region of the first conductivity type adjoining the fourth region and the second main surface of the semiconductor body and forming the emitter region of the second transistor, which fifth region is provided with a connection electrode.

Two npn or two pnp transistors form a cascode configuration in the semiconductor device, an emitter region of the first transistor at the same time forming a collector region of the second transistor. When the semiconductor device is in operation, the second transistor modulates an emitter current of the first transistor. A cascode circuit has connection electrodes for the collector and base of the first transistor and for the base and emitter of the second transistor.

European Patent no. 0493854 discloses a device of the kind mentioned in the opening paragraph in which the base region of the first transistor is connected to a connection electrode which is present on the second main surface of the semiconductor body. A highly doped connection region is provided between this electrode and the base region of the first transistor in order to connect this electrode to the base region of the first transistor. This connection region surrounds the collector, base, and emitter regions of the second transistor without making contact therewith.

The known device described has the disadvantage that the second transistor is fully driven into conduction during operation without a signal being applied to a base connection of this transistor.

SUMMARY OF THE INVENTION

The invention has for its object inter alia to construct the semiconductor device mentioned in the opening paragraph in such a way that the said disadvantage does not manifest itself.

According to the invention, the device is for this purpose characterized in that a depression is provided in the second main surface of the semiconductor body which cuts through the second, third, and fourth regions and laterally bounds these regions, while a connection electrode for the first region, which forms the base region of the first transistor, is provided in the depression.

The semiconductor device accordingly has a so-called mesa structure formed by a stacking of the second, third and fourth regions with an upper side to which the fourth and fifth regions adjoin, while the mesa structure is surrounded by the depression.

The invention is based on the recognition that latch-up occurs during operation in the known semiconductor device. The second transistor is fully driven into conduction then by a parasitic transistor formed by the connection region of the base of the first transistor and the third and fourth regions. When the device is operating, this parasitic transistor injects charge carriers from the highly doped connection region into the weakly doped third region. Because of the low doping level of the third region, only a few of the charge carriers will be injected into the fourth region, i.e. into the base region of the second transistor. The second transistor as a result is fully driven into conduction, so that latch-up occurs. The measure according to the invention does away with the connection region for the first region, the base region of the first transistor. The parasitic transistor formed now by the first, second, third and fourth regions has become very inefficient owing to the measure according to the invention. Injection of charge carriers now takes place from the first to the second region. These regions are approximately of the same doping level. The injected charge carriers will substantially entirely recombine in the second region, so that few or no charge carriers will reach the fourth region, i.e. the base of the second transistor, through the weakly doped third region. No latch-up will accordingly take place.

Preferably, the device according to the invention is characterized in that the first, second, third, and fourth regions are provided by means of epitaxy. The regions one to four are then provided one after the other in one series of process steps in a reactor. The doping levels of the different regions can be provided much more homogeneously and with sharper transitions between the regions by means of epitaxy. During the manufacture of the known device, previously manufactured regions will diffuse out during subsequent diffusion steps, so that these regions are not sharply defined. The switching behavior of the known semiconductor device is then not optimal. The switching behavior of the semiconductor device according to the invention is better than the switching behavior of the known device as a result.

The connection electrode for the first region, which forms the base region of the first transistor, may be interconnected with the first region in various ways. Thus, for example, a depression may be provided which cuts through the fourth, third, second, and first regions and extends down to the substrate. The connection electrode is then at the bottom of the depression, an electrical connection between the bottom of the depression and the first region being formed by a further region of the second conductivity type. This region is present in the substrate at the bottom of the depression, extends to below the first region and makes electrical contact with the first region. The connection electrode for the base of the first transistor is then on the further region. In an advantageous embodiment, the depression extends down to the first region forming the base region of the first transistor, and the connection electrode for this base region is provided on the first region. It is not necessary then to provide the first region on the bottom of the depression, whereby the semiconductor device is simpler to manufacture.

Preferably, a second depression is provided around the first depression, extending down to the substrate. The first region which forms the base region of the first transistor is thus separated from a further portion of the semiconductor body in a simple manner.

In an embodiment of the semiconductor device, silicon is used as the semiconductor material. An additional advantage is obtained when at least one of the base regions of the transistors contains germanium in addition to silicon. The semiconductor material of the base regions is given a smaller bandgap than that of silicon owing to the presence of germanium. The transistors then form heterojunction bipolar transistors (HBT). Such transistors are very fast and very efficient. The first and/or the fourth region, i.e. the base regions of the transistors, is/are comparatively heavily doped in order to obtain a comparatively low resistance in lateral direction (sheet resistance) so as to prevent that a base current through these transistors gives rise to voltage differences in lateral direction in the base regions. Owing to these voltage differences, certain portions of the transistors could carry more current than other portions (current crowding). A high doping level of the base regions, however, leads to comparatively low collector currents and a low transistor efficiency. In the semiconductor device according to the invention, the presence of germanium compensates for the adverse effect which the comparatively high doping level of the base regions has on the efficiency of the transistors.

When the first region forming the base region of the first transistor contains germanium in addition to silicon, moreover, the depression is easy to manufacture in that the second main surface of the semiconductor body is covered where the top of the mesa structure is to be formed, the fourth p-type region is etched, for example, in a plasma etching step, and subsequently the third and second n-type regions of the semiconductor body are etched in KOH. The etching process then automatically stops at the silicon-germanium material of the first region, because silicon-germanium regions are very badly etched in KOH.

BRIEF DESCRIPTION OF THE DRAWING

The invention will be described below in more detail by way of example with reference to the drawing, in which.

The figures are purely diagrammatic and not drawn to scale. Corresponding pans are generally given the same reference numerals in the figures.

DESCRIPTION OF THE PREFERRED EMBODIMENTS

Figure 1:
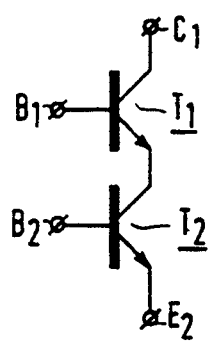
FIG. 1 shows two transistors in a cascode configuration.
Figure 2:
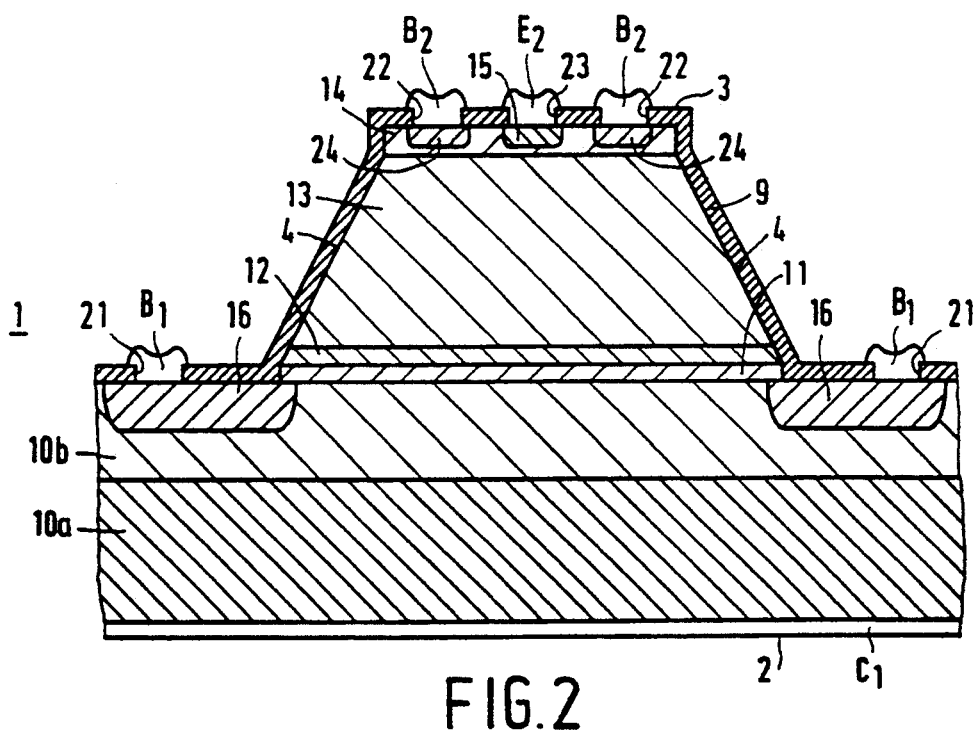
FIG. 2 shows a semiconductor body with two transistors in a cascode configuration according to a first embodiment.
Figure 3:
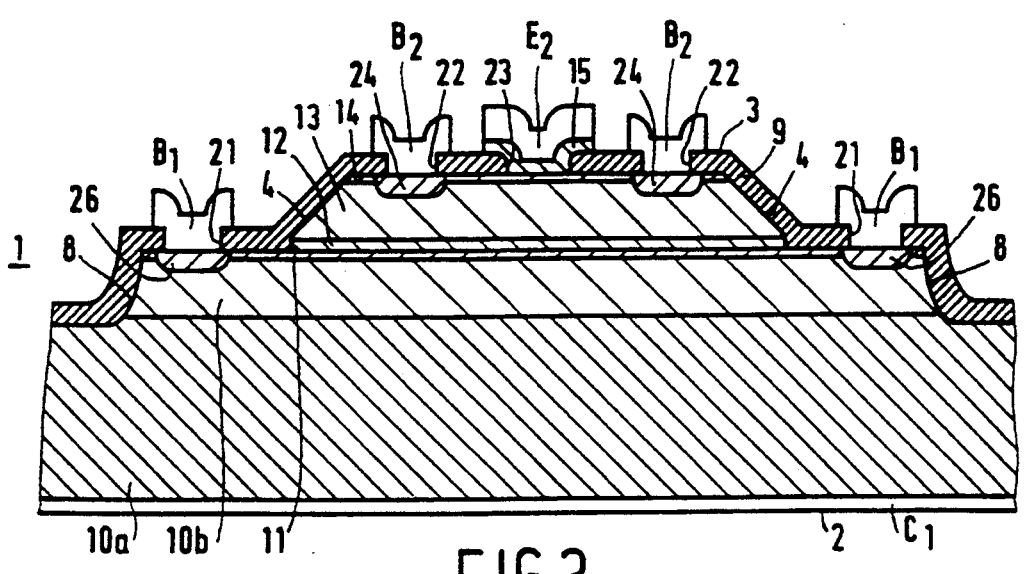
FIG. 3 shows a semiconductor body with two transistors in a cascode configuration according to a second embodiment.

FIG. 1 shows a first and a second bipolar transistor T1, T2 in a cascode configuration, i.e. the emitter of the first transistor is connected to the collector of the second transistor. FIGS. 2, 3 show a semiconductor device with a semiconductor body 1 provided with a first and a second bipolar transistor T1, T2 in a cascode configuration with collector 10a, 10b, 12, 13, base 11, 14 and emitter regions 12, 15 which form pn junctions with one another which extend parallel to a main surface 2 of the semiconductor body 1, which semiconductor body 1 comprises:

a semiconductor substrate 10 of a first conductivity type which forms the collector region of the first transistor T1 and is provided with a connection electrode C1 on a first main surface 2 of the substrate 10, a first semiconductor 11 region of the second, opposite conductivity type adjoining the substrate 10 and forming the base region of the first transistor T1, a second semiconductor region 12 of the first conductivity type adjoining the first region 11 and forming the emitter region of the first transistor T1 and forming the collector region of the second transistor T2, a third semiconductor region 13 of the first conductivity type adjoining the second region 12 and more weakly doped than the second region 12, a fourth semiconductor region 14 of the second conductivity type adjoining the third region 13 and a second main surface 3 of the semiconductor body 1 and forming the base region of the second transistor T2, which fourth semiconductor region is provided with a connection electrode B2, and a fifth semiconductor region 15 of the first conductivity type adjoining the fourth region 14 and the second main surface 3 of the semiconductor body 1 and forming the emitter region of the second transistor T2, which fifth region is provided with a connection electrode E2.

In the semiconductor device, two npn or two pnp transistors are connected in a cascode configuration (see FIG. 1), in which an emitter region 12 of the first transistor T1 is at the same time a collector region 12 of the second transistor T2. When the semiconductor device is operating, the second transistor T2 modulates an emitter current of the first transistor T1. The base of the first transistor T1 has a fixed direct-current setting (common base), while the second transistor T2 has a certain DC voltage level applied to its emitter (common emitter). The base of the second transistor T2 acts as a signal input, while the collector of the first transistor T1 acts as an output. A cascode arrangement has connection electrodes for the collector C1 and the base B1 of the transistor T1 and for the base B2 and the emitter E2 of the second transistor T2.

It is known to connect the base region 11 of the first transistor T1 to a connection electrode B1 present at the second main surface 3 of the semiconductor body 1 by means of a highly doped connection region.. This connection region surrounds the collector, base, and emitter regions 12, 13, 14, 15 of the second transistor T2 without making contact therewith. It is found that during operation the second transistor T2 is fully driven into conduction without a signal being applied to a base connection B2 of this transistor.

In addition, the known semiconductor device is difficult to manufacture. Thus the base, the connection and the collector region of the first transistor T1 and the base and emitter regions of the second transistor T2 must be provided in separate steps by means of photolithographical masking techniques and implantations, or diffusions.

According to the invention, a depression 4 is provided in the second main surface 3 of the semiconductor body 1, which depression cuts through and laterally bounds the second, third, and fourth regions 12, 13, 14, while a connection electrode B1 for the first region 11, which forms the base region of the first transistor T1, is provided in the depression 4.

The semiconductor device accordingly has a so-called mesa structure formed by a stacking of the second region 12 forming the emitter region of the first transistor T1 as well as the collector region of the second transistor T2, the third region 13 forming a space charge region associated with the collector of the second transistor T2, and the fourth region 14 forming the base region of the first transistor T1. The mesa structure comprises an upper side 3 to which the fourth and fifth regions 14, 15 adjoin, the mesa structure being entirely surrounded by the depression 4.

The invention is based on the recognition that the depression 4 renders a connection region for the base B1 of the first transistor T1 unnecessary. A parasitic transistor which causes latch-up is eliminated thereby. The first, second, third and fourth regions 11, 12, 13, 14, respectively, are provided by epitaxy in the device according to the invention. The device according to the invention can then be manufactured in a simpler manner than the known device. The first, second, third and fourth regions 11, 12, 13, 14 are now provided in succession in one series of process steps in a reactor. The doping levels of the different regions can be provided much more homogeneously and with sharper transitions between the regions by means of epitaxy. The properties of the transistors T1, 72 can then be better optimized, whereby, for example, the switching behavior of the semiconductor device according to the invention is much better than the switching behavior of the known device.

In the known device, the diffusion of the regions takes place through masks. These masks define the lateral dimensions of the regions. In the device according to the invention, the second, third and fourth regions 12, 13, 14 are patterned in one step when the depression 4 is provided, whereby the lateral dimensions are defined, so that a number of photolithographical masking and etching steps have become unnecessary in comparison with the manufacture of the known device.

In an embodiment of the semiconductor device, silicon is used as the semiconductor material. An additional advantage is obtained when at least one of the base regions 11, 14 of the transistors T1, T2 comprises germanium in addition to silicon. The semiconductor material of the first and/or the fourth region 11, 14 is given a smaller bandgap than that of silicon owing to the presence of germanium. The first and/or second transistor T1, 72 then forms a heterojunction bipolar transistor (HBT). Such transistors are fast and very efficient. The first and/or fourth region 11, 14, i.e. the base regions of the transistors T1, T2, are comparatively heavily doped for obtaining a comparatively low resistance in the lateral direction (sheet resistance), so as to prevent that a base current through these transistors could lead to voltage differences in lateral direction in the base regions 11, 14. Certain portions of the transistors T1, T2 could pass more current than other portions owing to these voltage differences (current crowding). A high doping level of the base regions 11, 14, however, leads to comparatively low collector currents and a low efficiency of the transistors. In the semiconductor device according to the invention, the presence of germanium compensates for the adverse effect which the comparatively high doping level of the base regions 11, 14 has on the efficiency of the transistors T1, T2.

The connection electrode B1 for the first region 11, which forms the base region of the first transistor T1, may be connected to the first region 11 in various ways.

FIG. 2 shows a first embodiment in which a depression 4 is provided which cuts through the fourth, third, second and first regions 14, 13, 12 and 11, respectively, and extends down to the substrate 10. The connection electrode B1 is then on the bottom of the depression 4, where an electrical connection between the bottom of the depression 4 and the first region 11 is formed by a further region 16 of the second conductivity type. This region 16 is present in the substrate 10 at the bottom of the depression 4, extends to below the first region 11 and makes electrical contact with the first region 11. The connection electrode B1 for the base of the first transistor B1 is then on the further region 16. Devices according to FIG. 2 are manufactured, for example, as follows. Starting with a highly doped n+-type silicon slice 10a, a 1.5 $\mu$m thick n−-type epitaxial layer 10b, which forms a space charge region for the collector of the first transistor T1, is grown so as to manufacture the substrate 10. The further p+-type regions 16 are provided in the epitaxial layer 10b in known manner by means of masking and implantation. Then the first 50 nm thick p-type region 11, which comprises approximately 20% germanium in addition to silicon, the second 100 nm thick n+-type region 12, the third 1 $\mu$m thick n-type region 13 and the fourth 150 nm thick p-type region 14 are epitaxially grown in a reactor. After that, approximately 300 nm plasma oxide is deposited on the surface 3 at a deposition temperature of approximately 400° C. The plasma oxide is patterned into an etching mask by means of photolithographical techniques, after which mesa structures are realized through etching of depressions 4. During etching, first the fourth p-type region 14 is etched anisotropically by means of plasma etching, after which the n-type third region 13 and the n+-type second region 12 are etched with KOH. The first region 11 of silicon-germanium acts as a stopper layer here, since silicon-germanium is very badly etched by KOH.

It is noted that the first layer can also be used as a stopper layer during KOH etching if no silicon-germanium material was used for the first region 11 when this first region comprises a comparatively high ($>10^{19}$/cm$^3$) p-type doping.

The first region 11 is then etched anisotropically again in a plasma. A plasma oxide 9 is subsequently deposited over the entire main surface 3 of the semiconductor body 1 by standard techniques. This oxide 9 passivates walls of the depressions 4 where the pn junctions between the regions come to the surface. A contact hole 23 for the emitter connection of the second transistor T2 is provided in this oxide 9. The fifth n+-type emitter region 15 is then provided through the emitter contact hole 23. Then contact holes 21, 22 for the base connections of the two transistors T1, T2 are provided and p+-type contact regions 24 are provided through the base contact hoes 21, 22. Subsequently, the connection electrodes B1, B2 and E2 are provided in known manner in the contact holes 21, 22, 23 by metallization and plasma etching. Finally, the first main surface 2 is also provided with a connection electrode C1. The semiconductor bodies, of which a large number are manufactured next to one another on the semiconductor slice, are finally detached flora one another by scribing and breaking. The semiconductor body is given a final mounting in an envelope.

FIG. 3 shows a second embodiment in which the depression 4 extends down to the first region 11, which forms the base region of the first transistor T1, and the connection electrode B1 for this base region is provided on the first region 11. The first region 11 then as it were continues over the bottom of the depression 4.

Devices according to FIG. 3 are manufactured as follows. The following are grown in that order on a highly doped n+-type silicon slice 10a: a 1.5 μm thick n⁻-type epitaxial layer 10b, the 50 nm thick first p-type region 11 which comprises approximately 20% germanium in addition to silicon, the second 100 nm thick n+-type region 12, the third 1 μm thick n⁻-type region 13, and the fourth 150 nm thick p-type region 14 which comprises approximately 20% germanium in addition to silicon.

In contrast to the first embodiment, the further region 16 need not be provided here after the epitaxial layer 10b has been provided. This means that the slice 10 need not be removed from the reactor in order to provide this region. Subsequently, in a manner analogous to that for the first embodiment, mesa structures are realized through etching of depressions 4. Again, the first region 11 acts as an etching stopper during etching of the n⁻-region 13 and the n+-region 12. Then a second depression 8 is provided around the first depression 4 and extending down to the substrate 10. The depression 8 is provided by means of a standard isotropic plasma etching technique. The first region 11 is thus separated from a further portion of the semiconductor body 1 in a simple manner. Subsequently, a plasma oxide 9 is deposited over the entire surface 3 of the semiconductor body 1 by standard techniques. In this oxide 9, subsequently, the emitter contact hole 23 is provided, after which a 200 nm thick polycrystalline silicon layer 15 is provided on the main surface 3 and doped by implantation so as to become n+-type. The polycrystalline silicon layer 15 is then patterned by standard photolithographical techniques. The fifth n+-type polycrystalline silicon region then acts as a so-called poly-emitter which is known per se. Contact holes 21, 22 for the base connections of the two transistors T1, T2 are then provided in the oxide 9. Then p+-type contact regions 24, 26 are provided through the base contact holes 21, 22. Subsequently, in known manner, the connection electrodes B1, B2 and E3 are provided in the contact holes 21, 22 and on the polycrystalline silicon region 15 by metallization and plasma etching. Finally, the first main surface 2 is also provided with a connection electrode C1. The semiconductor bodies, of which a large number are manufactured next to one another on the semiconductor slice 10, are finally detached from one another by scribing and breaking. The semiconductor body is given a final mounting in an envelope.

The invention is not limited to the embodiments described above. Thus, for example, the semiconductor material of the semiconductor body may alternatively be germanium or GaAs. Techniques other than those described, for example, diffusion instead of implantation, or wet chemical etching instead of plasma etching may be used. It is also possible for several base and emitter regions 14, 15 to be present in one mesa structure, for example, in the form of fingers. The oxide layer 9 may alternatively be made, for example, of TEOS instead of plasma oxide. The doping types may also be the opposites of those of the embodiments, i.e. the first conductivity type would then be p-type. The doping levels may also vary without detracting from the invention.

We claim:

1. A semiconductor device with a semiconductor body provided with a first and a second bipolar transistor in a cascode configuration with collector, base and emitter regions which form pn junctions with one another which extend parallel to a main surface of the semiconductor body, said semiconductor body comprising a semiconductor substrate of a first conductivity type which forms the collector region of the first transistor and is provided with a connection electrode on a first main surface of the substrate;

a first semiconductor region of the second, opposite conductivity type adjoining the substrate and forming the base region of the first transistor;

a second semiconductor region of the first conductivity type adjoining the first region and forming the emitter region of the first transistor and forming the collector region of the second transistor;

a third semiconductor region of the first conductivity type adjoining the second region and more weakly doped than the second region;

a fourth semiconductor region of the second conductivity type adjoining the third region and a second main surface of the semiconductor body and forming the base region of the second transistor, which fourth semiconductor region is provided with a connection electrode; and a fifth semiconductor region of the first conductivity type adjoining the fourth region and the second main surface of the semiconductor body and forming the emitter region of the second transistor, said fifth region being provided with a connection electrode;

characterized in that a depression is provided in the second main surface of the semiconductor body which cuts through the second, third, and fourth regions and laterally bounds these regions, while a connection electrode for the first region, which forms the base region of the first transistor, is provided in the depression.

2. A semiconductor device as claimed in claim 1, characterized in that the first, second, third, and fourth regions are provided by means of epitaxy.

3. A semiconductor device as claimed in claim 1, characterized in that the depression extends down to the first region which forms the base region of the first transistor, and in that the connection electrode for this base region is provided on the first region.

4. A semiconductor device as claimed in claim 3, characterized in that a second depression is provided around the first depression, extending down to the substrate.

5. A semiconductor device as claimed in claim 1, characterized in that at least one of the base regions of the transistors contains germanium in addition to silicon.

* * * * *